United States Patent [19]

Nahman et al.

[11] Patent Number: 4,742,295

[45] Date of Patent: May 3, 1988

[54] STATIC CONDUCTIVITY TESTER

[75] Inventors: Vance Nahman, Santa Clara, Calif.; Roger Fahlberg, Denver; James D. Shepherd, Evergreen, both of Colo.

[73] Assignee: The Gates Rubber Company, Denver, Colo.

[21] Appl. No.: 791,879

[22] Filed: Oct. 28, 1985

[51] Int. Cl.[4] ...................... G01R 27/02; G01R 31/02
[52] U.S. Cl. .................................. 324/133; 324/510; 324/62 R
[58] Field of Search ...................... 324/51, 54, 62–65, 324/133

[56] References Cited

U.S. PATENT DOCUMENTS

| | | | |
|---|---|---|---|
| 3,711,850 | 1/1973 | Kelly | 324/62 |
| 3,784,906 | 1/1974 | Ironside | 324/62 |
| 3,963,981 | 6/1976 | Vis | 324/62 |
| 4,122,389 | 10/1978 | Haagen | 324/133 |
| 4,321,530 | 3/1982 | Kelly | 324/133 |
| 4,321,543 | 3/1982 | Tuska | 324/133 |
| 4,496,906 | 1/1985 | Clack | 324/133 |

Primary Examiner—Reinhard J. Eisenzopf
Assistant Examiner—Jose M. Solis
Attorney, Agent, or Firm—C. H. Castleman, Jr.; H. W. Oberg, Jr.; J. E. Ebel

[57] ABSTRACT

An elastomeric belt and hose conductivity testing device incorporating a comparator network to verify that a belt or hose is either conductive or nonconductive (resistive) of the flow of static electricity. The device indicates whether the article being tested has a resistivity or conductivity which meets the industry standard of resistivity or conductivity for that particular article. The testing device is battery powered so that it is easily portable for use in the field.

3 Claims, 3 Drawing Sheets

STATIC CONDUCTIVITY TESTER

BACKGROUND OF THE INVENTION

This invention relates to a battery-powered device for testing the static conductivity or resistivity of elastomeric articles. U.S. Pat. No. 3,963,981 to Vis discloses a leakage and continuity tester for testing medical instruments for ground impedance and leakage current. U.S. Pat. No. 3,784,906 to Ironside, discloses a multiple null bridge that uses amplifiers to test a known resistance against an unknown resistance.

In certain applications the static conductivity of a hose or belt can be critical to the safety of the work environment. A build-up of static charge in a hose or belt that is in service within a hazardous atmosphere can result in an explosion. The Rubber Manufacturers Association (RMA) has promulgated standards for the maximum acceptable resistivity of elastomeric belts in a hazardous atmosphere. A device that can determine if an elastomeric article meets this standard is necessary to ensure safe operation in a hazardous atmosphere. For example, a hose with two wires running throughout its length is only conductive if the same wire is grounded to the couplings at each end. A testing device such as the one disclosed herein, can verify to the operator that the hose is connected properly, ensuring safe operation.

A testing device that provides a readout of the resistivity or conductivity of an elastomeric article is complex to interpret and calibrate. For example, the RMA test for belt conductivity requires that the belt have a resistivity of 6 megohms or less when 500 volts is applied a specified distance across the article. There are different predetermined industry standards for testing nonconductivity as well as for testing the resistivity and conductivity of hose articles. Since there are many tests, and each test has a different threshold value that determines whether an article passes or fails the test, a device which only provides the actual resistivity of the article being tested is somewhat difficult for the operator to interpret. Since the primary purpose of a testing device of this type is to determine if the article is suitable for a particular service, a read-out of pass/fail has more significance to the operator than the read-out of the actual resistivity of the article. A device that provides a pass/fail readout for various elastomeric articles being tested for resistivity or conductivity was deemed highly desireable. Such a device is the object of the invention.

SUMMARY OF THE INVENTION

The invention pertains to a battery-powered device which indicates whether a particular elastomeric article is sufficiently resistant to or conductive of static electricity for the specific application. The device includes a comparator network comprised of two amplifiers. The amplifiers compare the potential from an input test branch circuit that includes switching mechanism circuitry and the resistance across two probes provided by the elastomeric article being tested with the potential from a reference branch circuit which contains resistance which remain constant from test to test. If the test potential exceeds the reference potential, then a light illuminates indicating that the device has "passed" the test. If the reference potential exceeds the test potential than a light illuminates indicating that the device has "failed" the test. The test potential must exceed the reference potential for the device to indicate "pass", whether the device is set for testing resistivity or conductivity. In order to achieve this uniform result, each available setting appropriately scales the input test branch potential as detected by the comparator network; scaling is achieved by connecting electrical components in various configurations to create a unique switching mechanism circuit for each setting. The invention is equipped with a selector switch that enables the operator to select a setting for the article being tested, and whether the article is to be tested for conductivity or resistivity. The selector switches trip corresponding switches in the circuitry to make the appropriate comparison.

BRIEF DESCRIPTION OF THE DRAWINGS

Certain preferred forms of the invention will be described with reference to the accompanying drawings, wherein like numerals designate like parts, and in which.

PREFERRED EMBODIMENTS OF THE INVENTION

Figure 1:
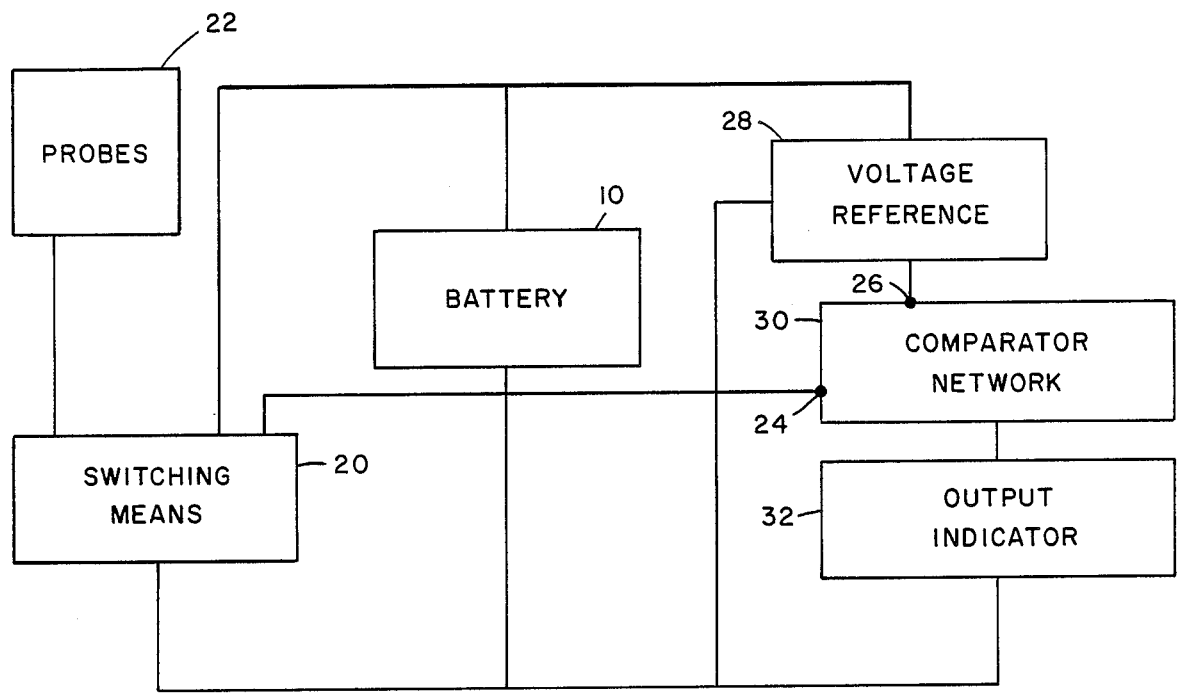
FIG. 1 is a block diagram of the network of the invention.

Referring first to FIG. 1, the static conductivity tester comprises comparator network 30, switching means 20, battery 10, probes 22, and output indicator 32 connected as shown.

The comparator network 30 receives input potential from points 24 and 26. If the potential at 24 is higher than the potential at 26, then a light indicating pass is illuminated in output indicator 32. Similarly, if the potential at 26 exceeds the potential at 24, then a light indicating fail is illuminated in output indicator 32.

Figure 2:
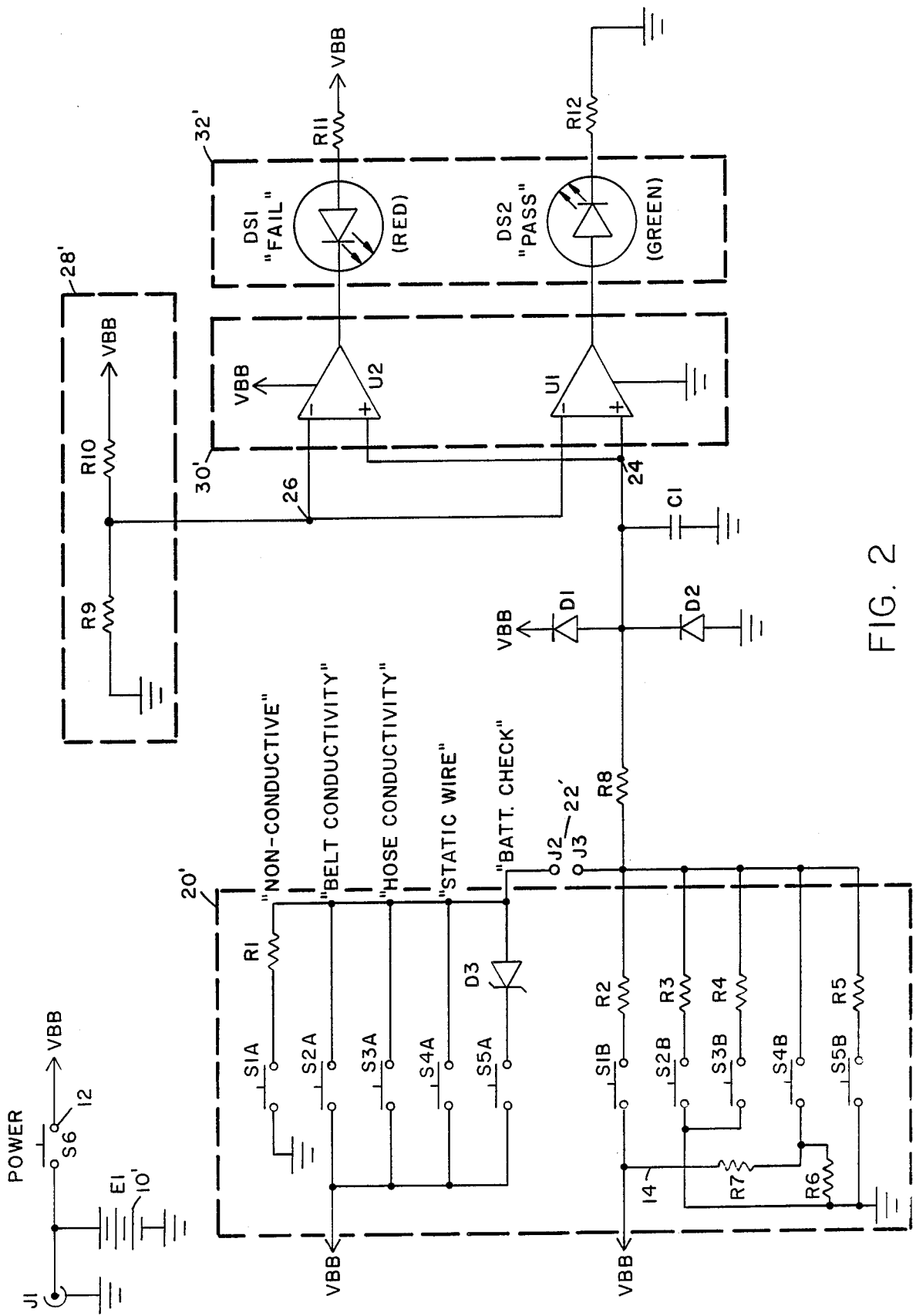
FIG. 2 depicts the detailed circuitry of the static conductivity tester.

Referring in detail to the embodiment of FIG. 2, the switching means can be seen to consist of many switches. The settings available are "nonconductive" (resistive) S1A, "belt conductivity" S2A, "hose conductivity" S3A and "static wire" S4A. By selecting the desired setting, the operator trips a corresponding switch in the electrical hardware S1B, S2B, S3B, or S4B. Switch S5A is a battery check that is done with the probes 22 shorted, corresponding switch S5B is also tripped during battery check and the Zener reference D3 provides the necessary voltage drop to determine if the battery has sufficient voltage. The light indicating pass DS2 illuminates if the battery output is sufficient as compared to the Zener reference.

Figure 3:
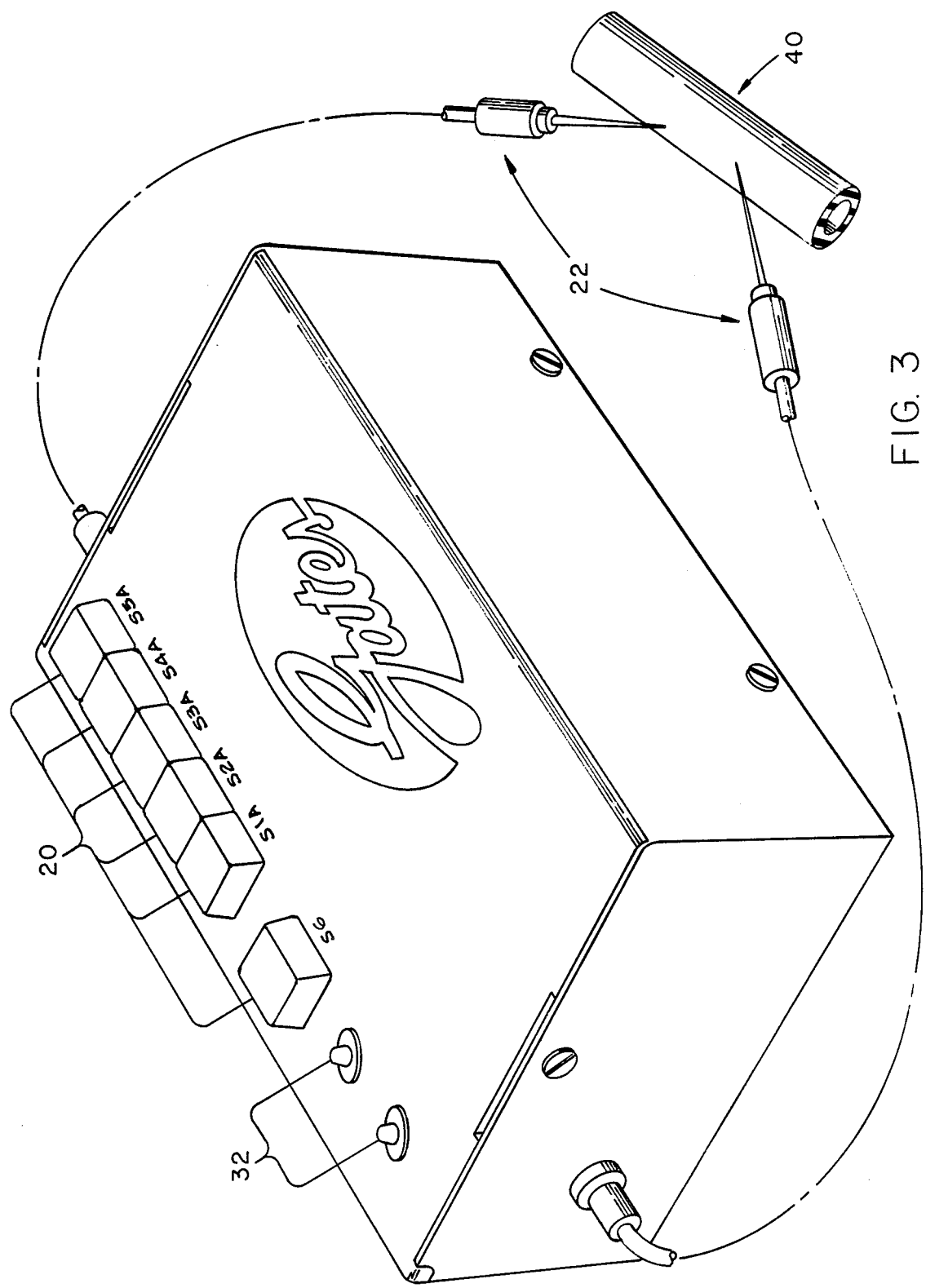
FIG. 3 is a figure of the enclosed device as it would appear if testing a hose.

For testing the conductivity or resistivity of an elastomeric article, the probes 22 must be placed a specified distance apart on the article, as shown in FIG. 3. The article then, provides a resistance through which the current flows. Resistances R2, R3, R4, R6, and R7 are incorporated into the electrical hardware. The switching mechanism 20' is used to select which resistances the current will flow through for a given test. The values of resistances R2, R3, R4, R6, and R7 were back calculated using the industry standards for acceptable static conductivity of belts and hoses. The standards are used as the maximum resistance across the probes in order for the device to indicate "pass", if the device is set for testing the conductivity of the article.

Comparator network 30' comprises two current differential-input comparators U2 and U1. The inverting input terminals of U2 and U1 are connected to the reference branch circuit 28' through junction 26. The non-inverting input terminals of U2 and U1 are connected to the input test branch circuit through junction 24. The output terminal of U2 is connected to a light emitting diode DS1 which is continuously forward-biased by potential $V_{BB}$, but is connected to U2 in such a way that current cannot flow freely out of U2 through its output terminal. The output terminal of U1 is connected to a light emitting diode DS2 which is forward-biased when the potential at 24 exceeds the potential at 26 because, in that case, U1's output potential goes high. The voltage generated from the reference branch circuit 28' is the minimum potential that must be exceeded by the potential at junction 24, in order for the output indicator 32' to light the DS2 "pass" indication means. If the potential at 26 exceeds the potential at 24, the output indicator 32' indicates "fail" by causing DS1 to light. A reading of "pass" indicates that the elastomeric article being tested has the requisite "resistivity" or "conductivity" value according to the established industrial standards; and a reading of "fail" indicates the elastomeric article fails to have the requisite value.

As shown in FIG. 2, the tester circuitry is supplied with a source electrical potential $V_{BB}$ by way of a voltage or power source 10' that substantially maintains the direct current voltage represented by E1. Potential $V_{BB}$ is supplied to the tester through switch S6. The switching mechanism 20' is connected to probes 22', which function as the means for flowing the electrical current of the testing device through the elastomeric article, and is also connected to current-limiting resistor R8. Resistor R8 is, in turn, connected to a first, second, and third branch which operate together to protect comparator network 30' from gross overvoltage. The first branch comprises a diode D1 that is reversed-biased due to $V_{BB}$. The second branch comprises a reversed-biased diode D2 connected to ground potential. The third branch comprises capacitor C1 connected to ground potential. The electrical potential seen at junction 24, is that generated from the input test branch circuit comprising the elements described above, namely, the switching mechanism 20', probes 22', resistor R8, and the first, second, and third branches. The electrical potential seen at junction 26, is that generated from the reference branch circuit 28' comprising resistors R9 and R10 and the source electrical potential $V_{BB}$.

The simplicity of the device can be appreciated by referring to FIG. 3. The operator only has to turn the device on and select the desired test as provided by the switching means 20. Note that the switch number of FIG. 3 correspond to the switch number and their designated functions in FIG. 2, and that the actual embodiment can designate the function of each switch in a variety of ways. By placing the probes 22 a specified distance apart on an elastomeric article, shown as a hose 40, the device will indicate if the article "passes" or "fails" by illumination of the appropriate light in output indicator 32.

It should be noted that the device, when testing belt resistivity, does not duplicate the RMA test, which requires that 500 volts be applied across the article to determine if the belt is sufficiently resistive. Rather the device correlates to the RMA test, so that using the 8 volt power source in the instant device results in an accurate determination of whether the belt would pass or fail the RMA test. Many belts were tested for resistivity using both the tester disclosed herein and the RMA test. The correlation between the resulting RMA test read-out and the pass or fail reading given by the tester was found to be 100%.

The components of the circuit illustrated in FIG. 2 was further described in the table below. The values and descriptions of the components represent the best mode known at this time for carrying out the invention, but in no way limit the components to the particular arrangement of elements shown, or to the values and function of the component provide an inadequate description to obtain the component.

| Component | Value | Description |
| --- | --- | --- |
| R1 | 15K | Resistor |
| R2 | 16.4 M | Resistor |
| R3 | 3.3 M | Resistor |
| R4 | 33.6K | Resistor |
| R5 | 22 ohms, ½ W | Resistor |
| R6 | 23.7 ohms, 1% | Resistor |
| R7 | 750 ohms | Resistor |
| R8 | 20K | Resistor |
| R9 | 10K, 1% | Resistor |
| R10 | 20K, 1% | Resistor |
| R11 | 100 ohms | Resistor |
| R12 | 100 ohms | Resistor |
| D1 | — | Diode, #In 4148 |
| D2 | — | Diode, #In 4148 |
| D3 | 4.7 v, 5% | Diode, #In 4732A (Zener reference) |
| C1 | .01 Farads | Capacitor |
| U1 | — | Dual Op. Amp. OA2, #LM311 |
| U2 | — | Dual Op. Amp. OA2, #LM311 |
| E1 | 8 v, 2.5 AH | Gates Battery 4 "D" Cells |

It will be understood that a variety of modifications and variations may be employed without departing from the spirit and scope of the invention, as defined by the appended claims. For instance, the voltage reference could contain any value of resistances against which it is desired to test a certain article, changing the values of the resistances in the switching mechanism accordingly. Also, the probes could be replaced by a variety of means to test the resistance across the article. The invention in no way is intended to be limited by the specific components or arrangement of component shown in the preferred embodiment of FIG. 2.

What is claimed is:

1. A tester for comparing the resistivity or conductivity of an elastomeric article against a predetermined standard to determine its suitability for a specific application, said tester comprising:

a direct current voltage source capable of supplying the tester with a source electrical potential;

means for flowing the electrical current of the testing device through the elastomeric article to be tested;

switching mechanism circuitry with multiple settings that provides a means for selecting one of the settings, each setting selected to trip a switch within the switching mechanism circuitry that corresponds to a particular configuration of electrical components to correspond to a type of test; wherein at least one setting is capable of checking the source electrical potential of the direct current voltage source so that the output indicator will indicate "pass" if the direct current voltage source is holding a voltage sufficient to supply the tester with the source electrical potential necessary to allow the tester to test the elastomeric articles against the predetermined standards;

a comparator network comprising two direct current differential-input comparator amplifiers, each amplifier having a first inverting and second non-inverting input terminal and an output terminal, wherein each of the first inverting input terminals is connected to a reference branch circuit comprising at least one known resistance and the source electrical potential, and wherein each of the second non-inverting input terminals is connected to an input test branch circuit comprising the source electrical potential, the switching mechanism, and the means for flowing the electrical current; the comparator network serving to compare the potential generated from the reference branch circuit with the potential generated from the input test branch circuit; and an output indicator comprising a "fail" indication means connected to one of the two comparator amplifiers by way of its output terminal, and a "pass" indication means connected to the other one of the two comparator amplifiers by way of its output terminal; the output indicator to indicate "pass" when the potential generated from the input test branch circuit exceeds the potential generated from the reference branch circuit, and the output indicator to indicate "fail" when the potential generated from the reference branch circuit exceeds the potential generated from the input test branch circuit.

2. The tester of claim 1 wherein the means for flowing electric current through the elastomeric article of unknown resistance is by the use of probes placed a specific distance apart on the article.

3. The tester of claim 1, wherein the direct current voltage source is a suitable electrochemical battery means, and wherein the comparator network is protected from gross overvoltage and excess current by connecting a first, second, and third branch to the input test branch circuit and placing a current-limiting resistor into the input test branch circuit, the first branch comprising a diode and the source electrical potential, the second branch comprising a diode, and the third branch comprising a capacitor.

* * * * *